(12) United States Patent
Byun et al.

(10) Patent No.: US 6,177,679 B1
(45) Date of Patent: Jan. 23, 2001

(54) ION IMPLANTER WITH IMPURITY INTERCEPTOR WHICH REMOVES UNDESIRED IMPURITIES FROM THE ION BEAM

(75) Inventors: Hyun-og Byun, Kyungki-do; Yun-mo Yang, Seoul, both of (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/234,499

(22) Filed: Jan. 21, 1999

(30) Foreign Application Priority Data

Apr. 13, 1998 (KR) ................................................ 98-13125

(51) Int. Cl.[7] ................................................ H01J 37/141
(52) U.S. Cl. ........................................................ 250/492.21
(58) Field of Search ........................... 250/492.21, 492.2, 250/398

(56) References Cited

U.S. PATENT DOCUMENTS

| 5,130,552 | * | 7/1992 | Bright et al. ............... 250/492.21 |
| 5,134,307 | * | 7/1992 | Kamata et al. ............... 250/492.2 |
| 5,300,891 | | 4/1994 | Tokoro . |
| 5,306,922 | * | 4/1994 | O'Connor ................... 250/492.21 |
| 5,311,028 | * | 5/1994 | Glavish ..................... 250/492.21 |
| 5,438,203 | * | 8/1995 | Glavish et al. .............. 250/492.21 |
| 5,932,882 | * | 8/1999 | England et al. .............. 250/492.21 |

FOREIGN PATENT DOCUMENTS

| 9-115850 | 5/1997 | (JP) . |
| 92-18839 | 9/1992 | (KR) . |

* cited by examiner

*Primary Examiner*—Kiet T. Nguyen
(74) *Attorney, Agent, or Firm*—Jones Volentine, LLC

(57) ABSTRACT

An ion implanter which prevents undesired impurities from being implanted into a wafer has an ion source for producing an ion beam which is to be implanted into a wafer, an accelerator for accelerating the ion beam, and an impurity interceptor for intercepting impurities generated in the accelerator. The impurity interceptor has an intercepting plate electrically connected to a high voltage power supply, and an opening formed in the center of the plate. Undesired ions having an energy lower than the high voltage applied to the intercepting plate are intercepted, and only those desired ions having an energy higher than the high voltage applied to the intercepting plate pass through the opening.

8 Claims, 4 Drawing Sheets

ION IMPLANTER WITH IMPURITY INTERCEPTOR WHICH REMOVES UNDESIRED IMPURITIES FROM THE ION BEAM

BACKGROUND OF THE INVENTION

1. Field of the Invention

The present invention relates to an ion implanter for use in semiconductor manufacturing, and more particularly to an ion implanter equipped with an interceptor which intercepts undesired impurities in an ion beam.

2. Background of the Related Art

An ion implantation process, which facilitates control of impurity concentration and junction depth, is widely used to form an impurity layer in a semiconductor device, e.g., a source/drain area of a transistor. The ion implantation process involves ionizing a gas containing desired impurities, accelerating the ionized impurities, and implanting the result into a predetermined area of a semiconductor wafer.

Referring to FIG. 1, in a conventional ion implanter, an ion beam emitted from an ion source 10 passes through a pre-analyzing magnet 12 to remove undesired types of ions. Since ions having identical energies in a magnetic field exhibit different bending effects due to their mass, only those beams of the desired ions pass through the pre-analyzing magnet 12.

After passing through the pre-analyzing magnet 12, the ion beam is accelerated to a desired energy by an accelerator 14. Meanwhile, negative ions accelerated by the accelerator 14 reach a stripper canal (not shown). Here, the negative ions are changed into positive ions by a charge exchange process involving collisions with a gas such as $N_2$ gas. The positive ions pass through a post-analyzing magnet 16 and finally reach a wafer 18.

However, during the ion implantation process, undesired impurities can be generated at a main acceleration portion of the accelerator 14. The impurities generally have a different radius of curvature as compared to the high energy ion beam in the post-analyzing magnet 16, so that they are prevented from reaching the wafer 18. However, on occasion, the product of the mass M and the energy E of some impurities can be the same as that of the ion beam. In such cases, since the impurities have the same radius of curvature as the ion beams, they are likely to pass through the post-analyzing magnet 16 and reach the wafer 18. For example, impurities accelerated to several tens of kilo electron volts (KeV) can have the same radius of curvature as ions accelerated to hundreds of KeV, depending on the type of impurities. Thus, undesired impurities can pass through the post-analyzing magnet 16.

Even if the impurities reach the wafer 18, it is not easy to verify the arrival of the impurities. Also, even if only a very small amount of undesired impurities reach the wafer 18 and are present on the surface of the wafer 18, the undesired impurities can degrade the quality of a gate oxide film formed thereon and cause the gate oxide film to grow to an undesired thickness. As a result, the reliability of the semiconductor device is deteriorated, and the yield is reduced.

SUMMARY OF THE INVENTION

To solve the above problems, it is an objective of the present invention to provide an ion implanter including an impurity interceptor for preventing impurities from reaching a wafer.

Accordingly, to achieve the above objective, there is provided an ion implanter comprising: an ion source for producing an ion beam which is to be implanted into a wafer; an accelerator for accelerating the ion beam; and an impurity interceptor installed downstream of the accelerator, for intercepting impurities generated in the accelerator to prevent the impurities from reaching the wafer. It is preferable that the accelerator is a tandem accelerator.

The impurity interceptor comprises an intercepting plate installed in a path of the ion beam, and a high voltage power supply having an output port electrically connected to the intercepting plate. Here, a high voltage output from the high voltage power supply is applied to the intercepting plate in the form of a floating voltage. Also, the intercepting plate has an opening formed at its center for allowing desired ions in the ion beam to pass.

The impurity interceptor is located in the path of the ion beam, and may be self-contained, or may be installed in an output portion of the accelerator.

The ion implanter further comprises a pre-analyzing magnet and a post-analyzing magnet. The pre-analyzing magnet is installed between the ion source and the accelerator. The post-analyzing magnet may be installed downstream of the impurity interceptor, or the post-analyzing magnet may be installed between the accelerator and the impurity interceptor.

BRIEF DESCRIPTION OF THE ATTACHED DRAWINGS

The accompanying drawings, which are included to provide a further understanding of the invention and are incorporated in and constitute a part of this specification illustrate embodiments of the invention, in which.

DETAILED DESCRIPTION OF PREFERRED EMBODIMENTS

Figure 1:
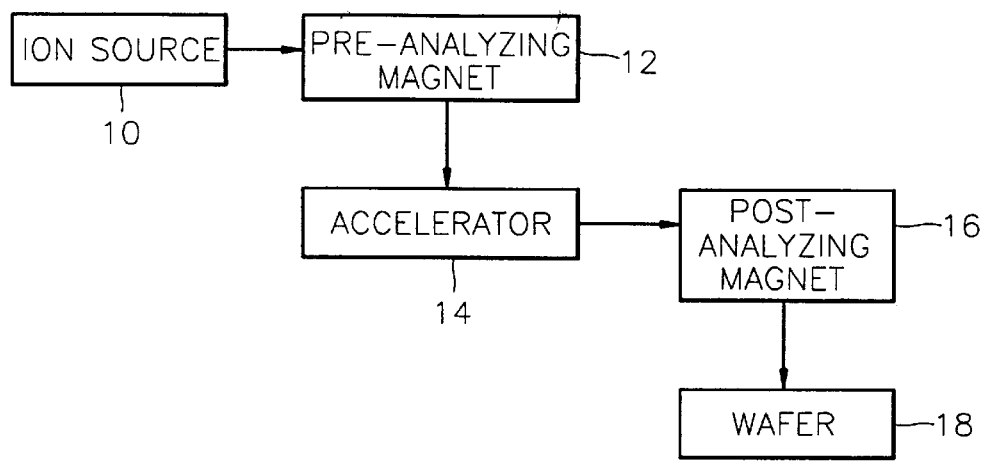
FIG. 1 is a block diagram of a conventional ion implanter.
Figure 2:
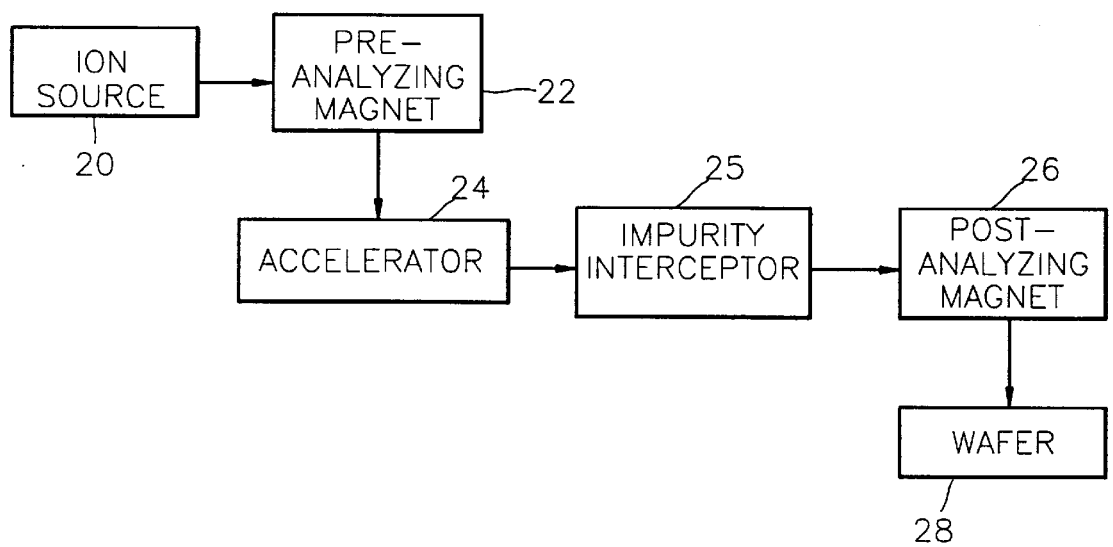
FIG. 2 is a block diagram of an ion implanter according to a first embodiment of the present invention.

Referring to FIG. 2, a gas containing desired impurities becomes a collection of positively charged particles by losing electrons after being irradiated by an ion source 20. Generally, the ion source 20 projects an electron beam emitted from a hot filament (not shown) into neutral atoms (the gas containing impurities) and separates electrons from the atoms. The thus-generated positive ions are changed into negative ions by passing them through a charge exchange cell (not shown). The negative ions are emitted from the ion source 20 as an ion beam to be used in ion implantation.

In order to produce the necessary ions, a molecular compound gas including the element of the necessary ions is typically supplied to the ion source 20. For example, $BF_3$ is used to produce boron ions, but when the molecular compound gas $BF_3$ is supplied to the ion source 20, undesired ions of many other molecules are generated as well as the $B^+$ ions. That is, the beam emitted from the ion source 20 consists of $_{10}B^+$, $_{10}BF^+$, $_{10}BF_2^+$, $_{10}BF_3^+$, $F_2^+$, $_{11}B^+$, $_{11}BF_2^+$ and $_{11}BF_3^+$. In addition, ions of several charges, such as $BF^{2+}$, and contaminants are mixed in the emitted beam.

In order to remove such undesired types of ions, the beam emitted from the ion source 20 passes through a pre-analyzing magnet 22. The pre-analyzing magnet 22 is typically an electromagnet which can control the strength of a magnetic field. An ion beam incident upon the pre-analyzing magnet 22 is bent by a magnetic field formed by the pre-analyzing magnet 22. The following Equation 1 represents the bending effect on an ion beam by the magnetic field:

$$HP = 4.5 \, q \, ME \quad (1)$$

wherein H is the intensity of a magnetic field, P is the radius of curvature of the ion beam (cm), M is the mass of an ion (amu), E is the energy of an ion (keV), and q denotes the unit charge of one electron.

It can be seen from Equation 1 that ions having the same energy in an identical magnetic field have different bending effects if they have different masses. Using the above principle, a beam of only desired ions passes through the pre-analyzing magnet 22.

The ion beam, after passing through the pre-analyzing magnet 22, is accelerated to an energy required for ion implantation by an accelerator 24 such as a tandem accelerator, based on Equation 2:

$$E = qV \quad (2)$$

wherein E is the final ion energy (keV), q is the unit charge of one electron, and V is the potential difference in the accelerator (kV).

Meanwhile, negative ions accelerated by the accelerator 24 reach a stripper canal (not shown), where the negative ions are changed into positive ions by a charge exchange process involving collisions with a gas such as $N_2$ gas. Only the desired positive ions pass through a post-analyzing magnet 26 before ultimately reaching a wafer 28.

However, during the ion implantation process, undesired impurities can be generated at a main acceleration portion of the accelerator 24. The impurities generally have a different radius of curvature as compared to the high energy ion beam in the post-analyzing magnet 26, so that they are prevented from reaching the wafer 28. However, on occasion, the product of the mass M and the energy E of some impurities can be the same as that of the ion beam. In such cases, as expressed in Equation 1, since the impurities have the same radius of curvature as the ion beams, they are likely to pass through the post-analyzing magnet 26 and reach the wafer 28. In order to intercept and remove the undesired impurities, a first embodiment of the present invention includes an impurity interceptor 25 disposed between the accelerator 24 and the post-analyzing magnet 26.

Figure 3:
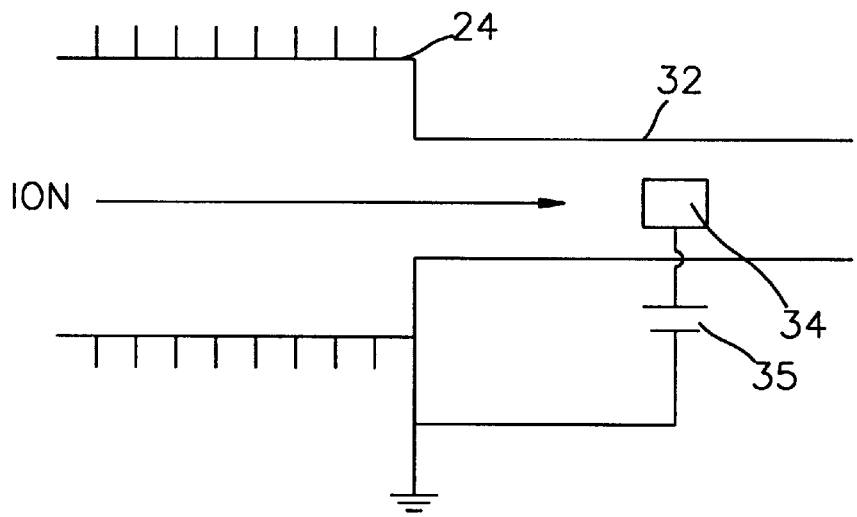
FIG. 3 is a schematic diagram of an impurity interceptor according to the present invention.
Figure 4:
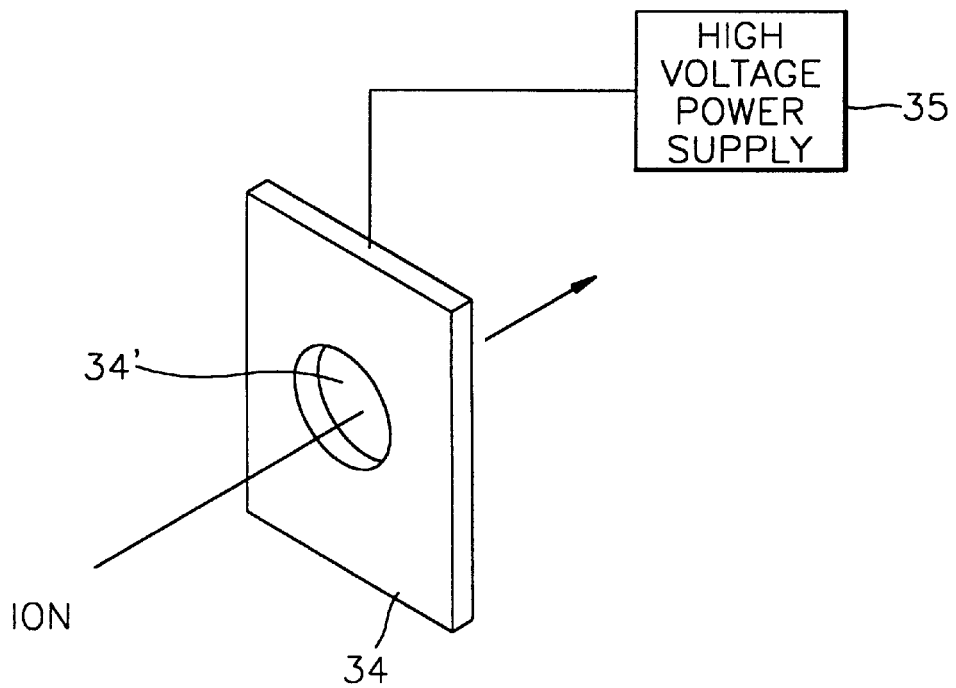
FIG. 4 is a detailed view of the impurity interceptor according to the present invention.

FIG. 3 is a schematic view of an impurity interceptor according to the present invention, and FIG. 4 is a detailed view of the impurity interceptor according to the present invention.

Referring to FIGS. 3 and 4, the impurity interceptor according to a first embodiment of the present invention is installed in a beam line 32, i.e., in an ion beam path, connected to the output of the accelerator 24, and includes a high voltage power supply 35 and an intercepting plate 34. The intercepting plate 34 is electrically connected to the output of the high voltage power supply 35 and has an opening 34' through which an ion beam can pass, formed at the center thereof. FIG. 4 shows an example of the intercepting plate 34. While the opening 34' depicted in FIG. 4 is round, the present invention is not limited to a round opening. A high voltage, e.g., 40 KV, output from the high voltage power supply 35 is applied to the intercepting plate 34 in the form of a floating voltage. Thus, impurities having an energy lower than the high voltage applied to the intercepting plate 34 are intercepted by the intercepting plate 34, and only the desired ion beam passes through the opening 34' of the intercepting plate 34. Consequently, undesired impurities are not entrained in the ion beam reaching the wafer 28, thus allowing an increase in reliability and yield of semiconductor devices.

Figure 5:
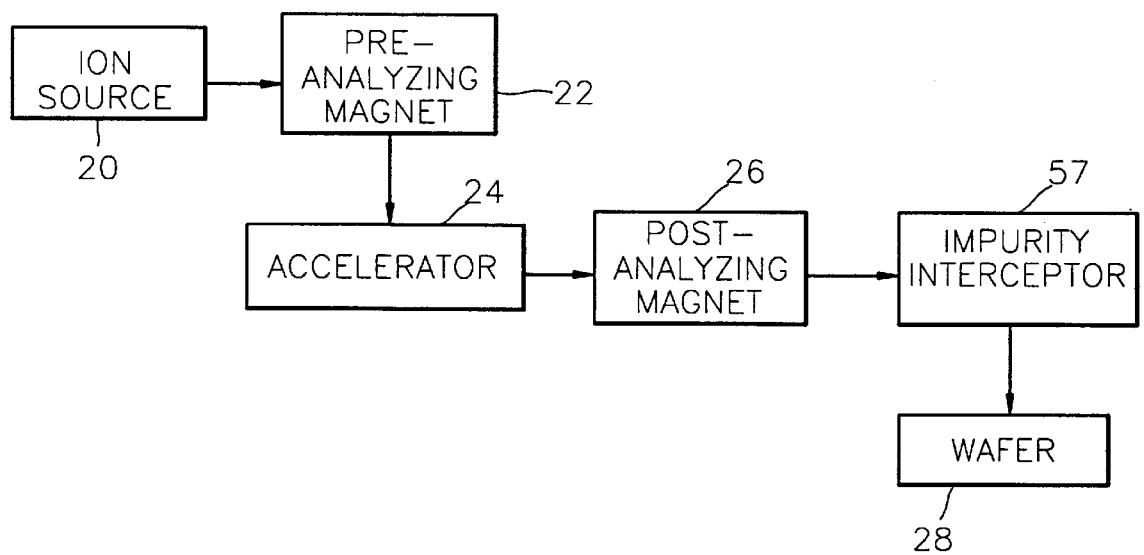
FIG. 5 is a block diagram of an ion implanter according to a second embodiment of the present invention.

FIG. 5 is a block diagram of an ion implanter according to a second embodiment of the present invention.

Referring to FIG. 5, ion source 20, pre-analyzing magnet 22, accelerator 24, post-analyzing magnet 26, and wafer 28 are the same as those described in the first embodiment, and thus will not be described again.

The ion implanter according to the second embodiment has an impurity interceptor 57 disposed after the post-analyzing magnet 26. The impurity interceptor 57 is structurally and functionally the same as the impurity interceptor 25 of the first embodiment, and thus will not be described again.

Figure 6:
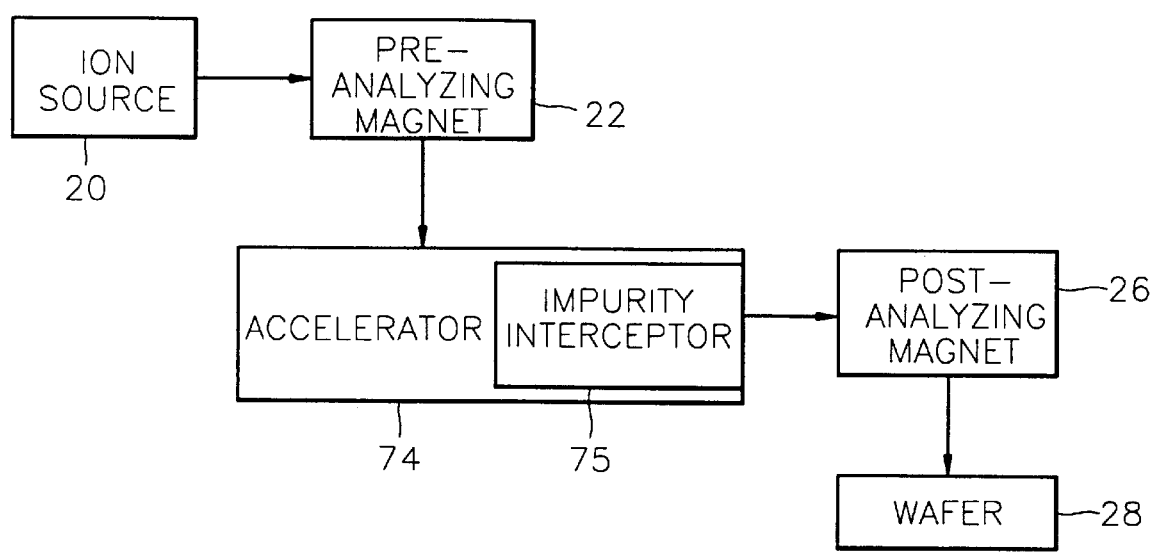
FIG. 6 is a block diagram of an ion implanter according to a third embodiment of the present invention.

FIG. 6 is a block diagram of an ion implanter according to a third embodiment of the present invention.

Referring to FIG. 6, ion source 20, pre-analyzing magnet 22, post-analyzing magnet 26, and wafer 28 are the same as those described in the first embodiment, and thus will not be described again.

The ion implanter according to the third embodiment of the present invention has an impurity interceptor 75 built into the output of an accelerator 74.

Figure 7:
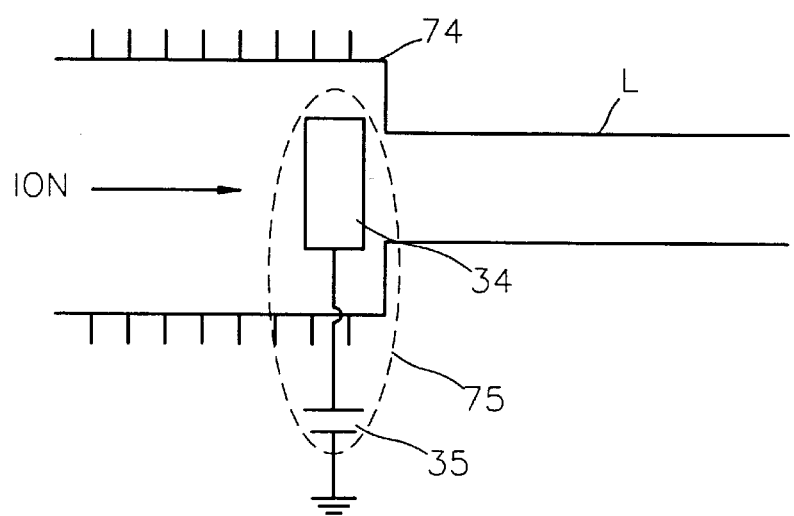
FIG. 7 is a schematic diagram of the impurity interceptor of FIG. 6.

Referring to FIG. 7, the impurity interceptor 75 has an intercepting plate 34 installed in the output portion of the accelerator 74. A high voltage power supply 35 for applying a high voltage, e.g., 40 KV, is electrically connected to the intercepting plate 34. The output of the accelerator is connected to a beam line L, such that accelerated ions enter the post-analyzing magnet 26. The intercepting plate 34 and the high voltage power supply 35 are the same as those described with reference to FIGS. 3 and 4. That is, an opening 34' that is preferably round, is formed at the center of the intercepting plate 34, through which only impurities having energies higher than the high voltage applied to the intercepting plate 34 can pass. The third embodiment of the present invention does not require a special device for shielding the impurity interceptor 75, since a higher voltage is supplied to the accelerator 74 than is applied to the impurity interceptor 75. That is, since an apparatus for shielding the high voltage supplied to the accelerator 74 has already been installed around the accelerator 74, another such special shielding device is not required.

The ion implanter having the impurity interceptor as described above prevents undesired impurities generated in a main acceleration portion of an accelerator from reaching a wafer, using an impurity interceptor installed after the accelerator and either before or after the post-analyzing magnet. Therefore, since only pure ions are implanted into the wafer, the yield and reliability of semiconductor devices are improved.

The present invention was described using the above-described embodiments, but it is not limited thereto. The embodiments are provided to complete the disclosure of the present invention and completely inform skilled persons of the category of the present invention. It is apparent that various modification and improvements may be effected within the technical spirit and scope of the present invention by those skilled in the art.

What is claimed is:

1. An ion implanter comprising:

an ion source for producing an ion beam which travels along an ion beam path in the implanter for implantation into a wafer;

an accelerator, disposed downstream from said ion source along said ion beam path, for accelerating the ion beam, said accelerator having an inlet portion through which the ion beam enters and an outlet portion through which the ion beam exits; and means for removing from the ion beam undesired impurity ions traveling along the same path as impurity ions desired for implantation and whose product of mass and energy is the same as that of the desired impurity ions but whose energy level is different than that of the desired impurity ions, said means for removing comprising an interceptor plate disposed in said ion beam path downstream of the inlet portion of the accelerator, and a high voltage power supply electrically connected to said interceptor plate so as to impress a voltage thereacross, whereby undesired impurity ions of an energy level lower than that of said voltage are removed from the ion beam by the interceptor plate.

2. The ion implanter as claimed in claim 1, wherein the accelerator is a tandem accelerator.

3. The ion implanter as claimed in claim 1, wherein said high voltage power supply is electrically connected to the intercepting plate so as to impress said voltage across the intercepting plate in the form of a floating voltage.

4. The ion implanter as claimed in claim 1, wherein the intercepting plate defines an opening therethrough sized relative to the ion beam and aligned with the ion beam path so that the desired ions of the ion beam can pass therethrough.

5. The ion implanter as claimed in claim 1, further comprising a pre-analyzing magnet installed between the ion source and the accelerator.

6. The ion implanter as claimed in claim 1, further comprising a post-analyzing magnet installed downstream of the impurity interceptor.

7. The ion implanter as claimed in claim 1, further comprising a post-analyzing magnet installed between the accelerator and the impurity interceptor.

8. The ion implanter as claimed in claim 1, wherein said interceptor plate is disposed in said output portion of the accelerator.

* * * * *